(12) United States Patent
Li

(10) Patent No.: US 11,017,155 B2
(45) Date of Patent: May 25, 2021

(54) METHOD AND SYSTEM FOR COMPRESSING DATA

(71) Applicant: Authpaper Limited, Kowloon (HK)

(72) Inventor: Chak Man Li, Kowloon (HK)

(73) Assignee: Authpaper Limited, Kowloon (HK)

(*) Notice: Subject to any disclaimer, the term of this patent is extended or adjusted under 35 U.S.C. 154(b) by 270 days.

(21) Appl. No.: 15/776,487

(22) PCT Filed: Nov. 8, 2017

(86) PCT No.: PCT/CN2017/109890
§ 371 (c)(1),
(2) Date: May 16, 2018

(87) PCT Pub. No.: WO2018/103490
PCT Pub. Date: Jun. 14, 2018

(65) Prior Publication Data
US 2020/0272784 A1    Aug. 27, 2020

(30) Foreign Application Priority Data
Dec. 6, 2016 (HK) .................. 16113902.2

(51) Int. Cl.
*G06F 40/149* (2020.01)
*H03M 7/30* (2006.01)

(52) U.S. Cl.
CPC ........ *G06F 40/149* (2020.01); *H03M 7/3077* (2013.01); *H03M 7/3091* (2013.01); *H03M 7/707* (2013.01)

(58) Field of Classification Search
CPC .... G06F 40/149; H03M 7/3077; H03M 7/707
USPC ...................................... 341/50, 87
See application file for complete search history.

(56) References Cited

U.S. PATENT DOCUMENTS 8,674,856 B2 *   3/2014   Agarwal .............. H03M 7/607
                                                  341/51
9,390,099 B1 *   7/2016   Wang .................. G06F 16/1744
2008/0240226 A1  10/2008  Okmianski

FOREIGN PATENT DOCUMENTS

WO    WO 2011/076130    6/2011

* cited by examiner

*Primary Examiner* — Khai M Nguyen
(74) *Attorney, Agent, or Firm* — Renner Kenner Greive Bobak Taylor & Weber

(57) ABSTRACT

A system and method for a non-transient computer readable medium containing program instructions for causing a computer to perform a method for compressing data comprising the steps of receiving a data string for compression, the data string including a plurality of data elements, creating a template based on processing the data string, the template including common information across all data elements of the data string, creating one or more entries, wherein the one or more entries include information that is different to the template, and storing the template and the one or more entries.

31 Claims, 12 Drawing Sheets

```
├── [Content_Types].xml
├── docProps
│       app.xml
│       core.xml
├── word
│       document.xml
│       fontTable.xml
│       settings.xml
│       styles.xml
│       webSettings.xml
│   ├── media
│   │       image1.jpg
│   ├── theme
│   │       theme1.xml
│   └── _rels
│           document.xml.rels
└── _rels
        .rels
```

Fig.11

| Uncompressed size: 89,007 bytes | This invention (All data are packaged into a ZIP archive default compression) | ZIP (Deflate best compression by 7-zip) | 7z (Bzip2 best compression by 7-zip) | 7z (LZMA2 best compression by 7-zip) |
|---|---|---|---|---|
| Compressed Size | 25,453 bytes | 77,580 bytes | 46,442 bytes | 38,184 bytes |
| Compression Ratio | 3.497 | 1.147 | 1.917 | 2.331 |

Fig.12

METHOD AND SYSTEM FOR COMPRESSING DATA

TECHNICAL FIELD

The present disclosure relates to a method and system for compressing data, in particular the present disclosure relates to a method for compressing data and a hardware system for compressing data, wherein the method and system are suited for compressing large volume data of any suitable format.

BACKGROUND

Data compression is commonplace in the current world. Electronic memory/storage/transmission bandwidth in a computing device is always limited. Memory/storage space is limited and therefore compressing data is commonly used to preserve memory/storage space or transmission bandwidth. Memory/Storage space or data transmission bandwidth has become a commodity that is traded and sold. Data compression is an essential part of this commodity in order to maximize the data or information that can be stored on an available memory space.

There are a number of well-known data compression methods that are used on a number of different data formats. For example, documents, video, audio and any other data formats can be compressed. Currently utilized and known compression algorithms and methods are generally universal compressors. This means that these known compression algorithms and methods use the same process to compress all formats of data such as documents, images, video and audio data.

However, the lossless data compression ratio of a universal compressor approach is lower than 2:1, thus saving no more than 50% of memory space, especially when applied to file formats that have built in data compression such as for example jpeg, mp3 or docx, pptx or pdf files. In order to achieve a higher compression ratios such as 20:1 or 40:1 many details of the actual data are often removed. To achieve higher compression ratios lossy compression algorithms or methods as applied to data. These lossy compression algorithms or methods generally remove some information from the data string or data file or data stream that is to be compressed to improve the compression ratio. This can be problematic as sometimes critical information can be lost. Further decompressing a file that has been compressed using a lossy compression algorithm or method results in an uncompressed file or string or stream that does not match the pre-compression file or stream or string.

Deflate, bzip2, LZMA are some well-known lossless compression algorithms or compression methods for archiving files. These compression algorithms are generally the default compression algorithms in common archiving data formats such as zip, rar, tar.gz and 7z. These three algorithms function by combining all input files into a long data string and performing compression on the string based on an arrangement and frequency of symbols within the string. However these algorithms do not result in a large compression ratio.

Image and video data often define data compression algorithms to compress the data. Algorithms like Deflate and RLE are commonly used to compress image or video data in a lossless manner. However generally lossless compression algorithms are not enough to sufficiently compress images or video frames. Lossy compression algorithms are not preferred due to loss of information. There is a need for a method of data compression or a compression algorithm that can sufficiently compress incoming data, with a sufficiently high compression ratio, in a lossless manner.

Reference to any prior art in the present disclosure is not, and should not be taken as, an acknowledgement or any form of suggestion that that prior art forms part of the common general knowledge in the field of endeavor in any country in the world.

SUMMARY OF THE INVENTION

It may be an object of certain embodiments disclosed herein to provide a method of compressing data or a data compression algorithm that may ameliorate one or more of the problems described above, or at might go at least some way toward at least providing the public or the computing profession or the data compression industry with a useful choice.

The present disclosure relates to a data compression method and a data compression system. The data compression system is a hardware computing system. The data compression method is executed by the hardware data compression system. The data compression method, as executed by the data compression system, is advantageous because it results in a compressed data that is of smaller in size than at least one known compression method. The data compression method is advantageous because the smaller sized compressed data uses less memory for storage.

In accordance with a first aspect, the present disclosure relates to a non-transient computer readable medium containing program instructions for causing a computer to perform a method for compressing data comprising the steps of:

receiving a data string for compression, the data string including a plurality of data elements, creating a template based on processing the data string, the template including common information across all data elements of the data string, creating one or more entries, wherein the one or more entries include information that is different to the template, and storing the template and the one or more entries.

In an embodiment in the non-transient computer readable medium, the step of creating one or more entries comprises the additional step:

identifying the differences between each data element of the data string and the created template, and wherein each entry corresponds to a single data element of the plurality of data elements and the entry includes the difference between the data element and the template.

In an embodiment in the non-transient computer readable medium the step of creating the template comprises the steps of:

comparing the data elements with each other, identifying common information across two or more data elements, creating a template that includes the common information across two or more data elements.

In an embodiment in the non-transient computer readable medium, the method of compressing data comprises the additional steps of:

creating a representation of each data element of the plurality of data elements, wherein the representation is a format that allows data elements to be compared with each other, temporarily storing each representation of each data element.

In an embodiment in the non-transient computer readable medium, the method of compressing data comprises the additional steps of:

determining an entropy of each representation, wherein entropy is a measure of data structures within the data elements, sorting representations based on the entropy of each representation.

In an embodiment in the non-transient computer readable medium, the method of compressing data comprises the additional steps of:

comparing pairs of representations to identify common information in a pair of representations, creating a plurality of templates that include common information, wherein each template includes common information in a pair of representations, creating N/2 templates, wherein N is the number of representations.

In an embodiment in the non-transient computer readable medium, the method of compressing data comprises the additional steps of:

comparing pairs of representations to identify information common to the pair of representations, collating the common information into a sub template, creating a plurality of sub templates, wherein the sub template includes common information in a pair of representations.

In an embodiment in the non-transient computer readable medium, the method of compressing data comprises the additional steps of:

comparing a pairs of sub templates to identify common information across the sub templates, creating additional secondary templates based comparing pairs of sub templates, wherein the secondary templates include common information across the sub templates, comparing the secondary templates with each other to identify common information across the secondary templates, creating the template based on the common information across the secondary templates, wherein the template includes information that is common across the secondary templates.

In an embodiment in the non-transient computer readable medium, the method of compressing data comprises the steps of:

identifying a template penalty value when comparing pairs of sub templates, wherein the template penalty value is the difference between a pair of sub templates, and if the template penalty value is greater than 10% then sub templates are stored separately.

In an embodiment in the non-transient computer readable medium, the template will be removed.

In an embodiment the template and the secondary templates are stored as a set of templates in a folder or a file.

In an embodiment in the non-transient computer readable medium, the method of compression comprises the additional step of:

comparing each data element with the set of templates to identify one or more differences between each data element and a template or secondary template or sub template, identifying a template or a secondary template or sub template from the set of templates that results in the smallest difference with each element, identifying an indicator of the corresponding template or sub template or secondary template, creating an entry, wherein the entry is a compressed data element and the entry comprises the smallest difference between a corresponding template or sub template or secondary template and the indicator, storing the entry and;

deleting any secondary templates or sub templates from the set of templates that are not used in creating the entry.

In an embodiment in the non-transient computer readable medium, the method of compressing data comprises the step of updating the template with additional common information identified in any additional data element that is processed.

In an embodiment in the non-transient computer readable medium, the method of compressing data comprises the additional step of updating the set of templates to include a new sub template or secondary template if new common information is identified in the step of comparing the data element with the set of templates.

In an embodiment in the non-transient computer readable medium, the step of creating a template comprises the additional steps of:

comparing a pair of data elements with each other, identifying common data structures to both data elements in the pair of data elements, creating a template that includes the common data structures, comparing a further data element with the template, updating the template to include additional data structures that are common between either the further data element and at least one or a pair of data elements, or the further data element and the template.

In an embodiment in the non-transient computer readable medium, the template being constantly updated after processing each subsequent data element to identify data structures within each subsequent data element.

In an embodiment in the non-transient computer readable medium, the method of compressing data comprises the additional steps of:

comparing each data element with the template, identifying information that is different between the data element and the template, creating an entry by storing the information that is different between the data element and the template, wherein each entry corresponds to a single data element.

In an embodiment in the non-transient computer readable medium, the method of compressing data comprises the additional step of decompressing data based on an entry and a corresponding template, wherein the step of decompressing data comprises the additional steps of:

identifying an entry for decompression, populating the template with information that is included in the entry, creating a file or data element that includes information from the template and information from the entry, wherein the file or data element corresponds to an uncompressed entry.

In an embodiment in the non-transient computer readable medium, the method of compressing data comprises the additional step of:

executing an optimization process, wherein the optimization process comprises decompressing all entries that are a size that is more than half the size of the corresponding data element, and, wherein the optimization process further comprises recompressing the decompressed entries by comparing the decompressed entries with a set of templates to create new compressed entries that are less than half the size of corresponding data element.

In an embodiment the data string comprises a plurality of data files, wherein each data element is a data file.

In accordance with a second aspect, the present disclosure relates to a system for compressing data, the system comprising;

a processor, a memory unit, wherein the processor is in electronic communication with the memory unit, the memory unit configured to store executable instructions defining a method of compressing data, the processor configured to execute the method of compressing data;

the processor being configured to receive a data string for compression, wherein the data string including a plurality of data elements, the processor being configured to create a template based on processing the data string, the template including common information across all data elements of the data string, the processor configured to create one or more entries, wherein the one or more entries include information that is different to the template, and the processor configured to store the template and the one or more entries in the memory unit.

In an embodiment, the processor is configured to identify the differences between each data element of the data string and the created template, and wherein each entry corresponds to a single data element of the plurality of data elements and the entry includes the difference between the data element and the template.

In an embodiment of the system for compressing data;

the processor being configured to compare the data elements with each other, the processor being configured to identify common information across two or more data elements, and the processor configured to create a template that includes the common information across two or more data elements.

In an embodiment of the system for compressing data;

the processor being configured to create a representation of each data element of the plurality of data elements, wherein the representation is a format that allows data elements to be compared with each other, the processor being configured to temporarily store each representation of each data element in the memory unit, the processor being configured to determine an entropy of each representation, wherein entropy is a measure of data structures within the data elements, and the processor being configured to sort representations based on the entropy of each representation.

In an embodiment, the processor being configured to compare pairs of representations to identify common information in a pair of representations, the processor being configured to create a plurality of templates that include common information, wherein each template includes common information in a pair of representations, and;

the processor being configured to create N/2 templates, wherein N is the number of representations.

In an embodiment, the processor configured to compare pairs of representations to identify information common to the pair of representations, the processor being configured to collate the common information into a sub template, the processor being configured to create a plurality of sub templates, wherein the sub template includes common information in a pair of representations, the processor being configured to compare pairs of sub templates to identify common information across the sub templates, the processor being configured to create additional secondary templates based comparing pairs of sub templates, wherein the secondary templates include common information across the sub templates, the processor being configured compare the secondary templates with each other to identify common information across the secondary templates, and the processor being configured to create the template based on the common information across the secondary templates, wherein the template includes information that is common across the secondary templates.

In an embodiment, the processor being configured to identify a template penalty value when comparing pairs of sub templates, wherein the template penalty value is the difference between a pair of sub templates, and if the template penalty value is greater than 10% the processor being configured to store the sub templates separately as individual entries in the memory unit, and wherein the template and the secondary templates are stored as a set of templates in a folder or a file.

In an embodiment, the processor being configured to compare each data element with the set of templates to identify one or more differences between each data element and a template or secondary template or sub template, the processor further being configured to identify a template or a secondary template or sub template from the set of templates that results in the smallest difference with each element, the processor being configured to identify an indicator of the corresponding template or sub template or secondary template, the processor configured to create an entry, wherein the entry is a compressed data element and the entry comprises the smallest difference between a corresponding template or sub template or secondary template and the indicator, the processor configured to store the entry in the memory unit and;

the processor further being configured to delete any secondary templates or sub templates from the set of templates that are not used in creating the entry.

In an embodiment, the processor being configured to compare a pair of data elements with each other, the processor being configured to identify one or more common data structures to both data elements in the pair of data elements, the processor configured to create a template that includes the one or more common data structures, the processor configured to compare a further data element with the template, the processor being further configured to update the template to include additional data structures that are common between either the further data element and at least one or a pair of data elements, or the further data element and the template.

In an embodiment, the processor configured to updated the template after processing each subsequent data element to identify data structures within each subsequent data element, the template being stored in the memory unit.

In an embodiment, the processor being configured to compare each data element with the template, the processor being configured to identify information that is different between the data element and the template, the processor being configured to create an entry by including the information that is different between the data element and the template into the entry, wherein each entry corresponds to a single data element, and the processor being configured to store the entry in a memory unit.

In an embodiment, the processor being configured to execute an optimization process, the optimization process being stored as executable instructions in the memory unit, wherein as part of the optimization process the processor being configured to decompress all entries that are a size that is more than half the size of the corresponding data element, and, the processor further being configured to recompress the decompressed entries by comparing the decompressed entries with a set of templates to create new compressed entries that are less than half the size of corresponding data element, and the processor being configured to store the new compressed entries in a record on the memory unit.

In another aspect of the present invention, there is provided a computer system for compressing textual file formatted files, including text files, XML files, HTML files, UML files, MS Word document files, PDF files, Rich Text Format (RTF) files, postscript files, Latex files, comprising;

a processor, a memory unit, wherein the processor is in electronic communication with the memory unit, the memory unit configured to store executable instructions defining a method of compressing textual formatted files, the processor instructed by the executable instructions to execute the method of compressing textual formatted files;

the processor being configured to receive a data string from at least a portion of the textual formatted files for compression, wherein the data string including a plurality of text based structural elements, the processor being configured to create a template based on processing the data string, the template including common information across all text based structural elements of the data string, the processor configured to create one or more entries, wherein the one or more entries include information that is different to the template, and the processor configured to store the template and the one or more entries in the memory unit;

wherein the processor is further configured to identify the differences between each text based structural elements of the data string and the created template, and wherein each entry corresponds to a single data element of the plurality of text based structural elements and the entry includes the difference between the data element and the template;

the processor being configured to compare the text based structural elements with each other, the processor being configured to identify common information across two or more text based structural elements, and the processor configured to create a template that includes the common information across two or more text based structural elements; wherein the processor is configured to create a representation of each text based structural elements of the plurality of text based structural elements, wherein the representation is a format that allows text based structural elements to be compared with each other, the processor is configured to temporarily store each representation of each text based structural elements in the memory unit, the processor is configured to determine an entropy of each representation, wherein entropy is a measure of data structures within the text based structural elements, and the processor is configured to sort representations based on the entropy of each representation; wherein the processor is configured to compare pairs of representations to identify common information in a pair of representations, the processor is configured to create a plurality of templates that include common information, wherein each template includes common information in a pair of representations, and;

the processor is configured to create N/2 templates, wherein N is the number of representations; wherein the processor is configured to compare pairs of representations to identify information common to the pair of representations, the processor being configured to collate the common information into a sub template, the processor being configured to create a plurality of sub templates, wherein the sub template includes common information in a pair of representations, the processor being configured to compare pairs of sub templates to identify common information across the sub templates, the processor being configured to create additional secondary templates based comparing pairs of sub templates, wherein the secondary templates include common information across the sub templates, the processor being configured compare the secondary templates with each other to identify common information across the secondary templates, and the processor being configured to create the template based on the common information across the secondary templates, wherein the template includes information that is common across the secondary templates; wherein the processor being configured to identify a template penalty value when comparing pairs of sub templates, wherein the template penalty value is the difference between a pair of sub templates, and if the template penalty value is greater than 10% the processor being configured to store the sub templates separately as individual entries in the memory unit, and wherein the template and the secondary templates are stored as a set of templates in a folder or a file; wherein the processor being configured to compare each data element with the set of templates to identify one or more differences between each data element and a template or secondary template or sub template, the processor further being configured to identify a template or a secondary template or sub template from the set of templates that results in the smallest difference with each element, the processor being configured to identify an indicator of the corresponding template or sub template or secondary template, the processor configured to create an entry, wherein the entry is a compressed data element and the entry comprises the smallest difference between a corresponding template or sub template or secondary template and the indicator, the processor configured to store the entry in the memory unit and;

the processor further being configured to delete any secondary templates or sub templates from the set of templates that are not used in creating the entry; wherein the processor being configured to compare a pair of text based structural elements with each other, the processor being configured to identify one or more common data structures to both text based structural elements in the pair of text based structural elements, the processor configured to create a template that includes the one or more common data structures, the processor configured to compare a further text based structural element with the template, the processor being further configured to update the template to include additional data structures that are common between either the further data element and at least one or a pair of text based structural elements, or the further data element and the template; wherein the processor configured to updated the template after processing each subsequent data element to identify data structures within each subsequent data element, the template being stored in the memory unit; wherein the processor being configured to compare each text based structural element with the template, the processor being configured to identify information that is different between the text based structural elements and the template, the processor being configured to create an entry by including the information that is different between the text based structural elements and the template into the entry, wherein each entry corresponds to a single text based structural elements, and the processor being configured to store the entry in a memory unit; wherein the processor is configured to execute an optimization process, the optimization process being stored as executable instructions in the memory unit, wherein as part of the optimization process the processor being configured to decompress all entries that are a size that is more than half the size of the corresponding text based structural elements, and, the processor further being configured to recompress the decompressed entries by comparing the decompressed entries with a set of templates to create new compressed entries that are less than half the size of corresponding text based structural elements, and the processor being configured to store the new compressed entries in a record on the memory unit The term "comprising" (and its grammatical variations) as used herein are used in the inclusive sense of "having" or "including" and not in the sense of "consisting only of".

BRIEF DESCRIPTION OF THE DRAWINGS

Embodiments of the booking system and method of booking a room will now be described, by way of example, with reference to the accompanying drawings in which:

FIG. 11 shows an example of an XML representation of a docx file.

FIG. 12 shows a table illustrating the results of a test conducted between a method of compressing data as per the present disclosure as well as other known methods of compressing data.

DETAILED DESCRIPTION OF THE PREFERRED EMBODIMENT

The present disclosure is directed to a method of compressing data and a hardware system for compressing data. In particular a method for compressing data and the hardware system for compressing data are suited for compressing large volume data of any format in a lossless manner. The method of compressing data as described herein further achieves a compression ratio of larger than 2:1 for at least some data formats. The method of compressing data and hardware system for compressing data as described herein, are suited for compressing data files. The hardware system for compressing data is a hardware electronic system that includes one or more electronic components that are configured or arranged to perform the method of compressing data. Details of the method of compressing data and a hardware system for compressing data will be described below with reference to the figures.

Figure 1:
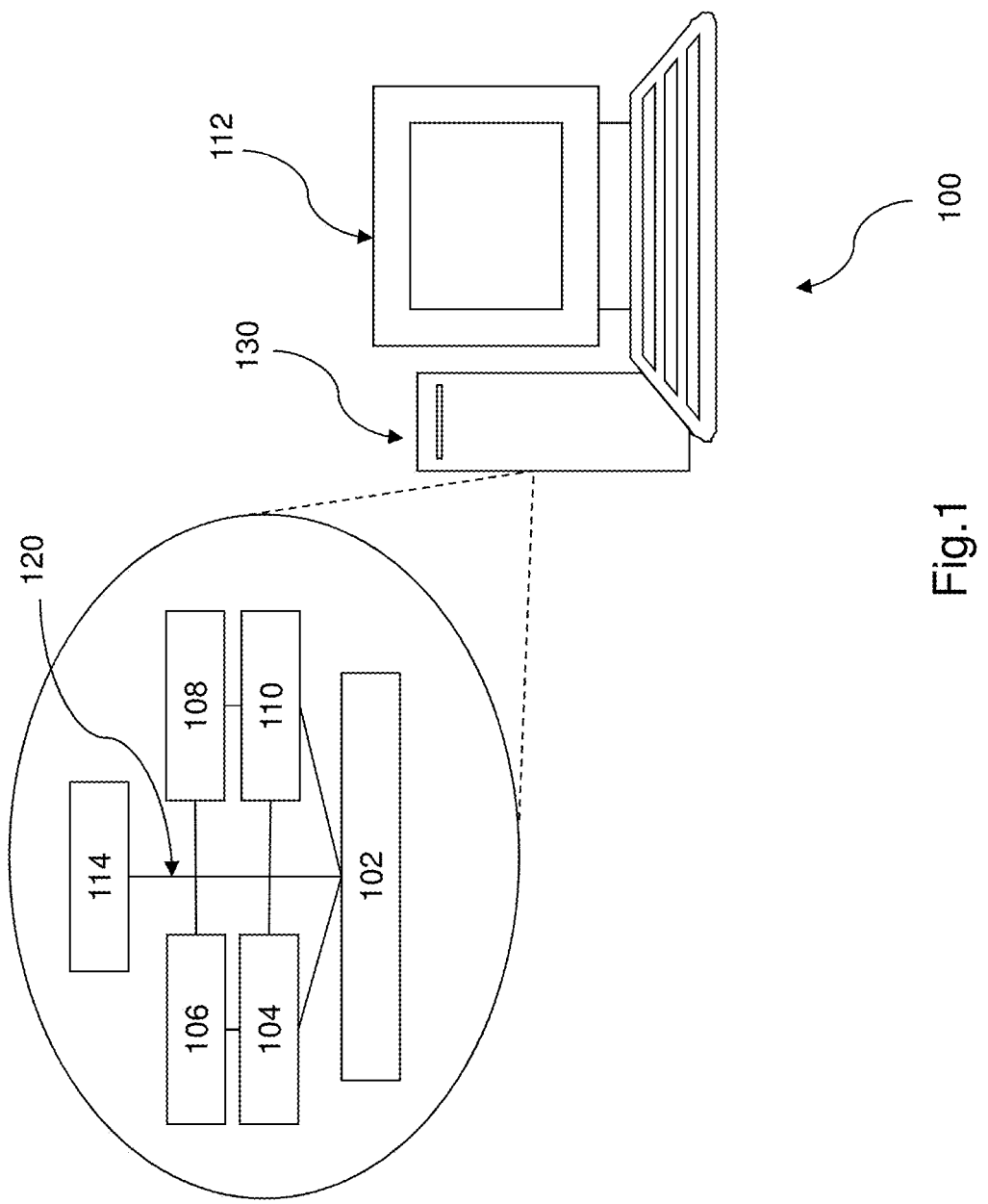
FIG. 1 shows a schematic diagram of a hardware computing system that is configured to execute a method of compressing data.

Referring to FIG. 1, an embodiment of a hardware system for compressing data 100 is illustrated. The illustrated embodiment is arranged to provide a system for compressing data, comprising a processor that is configured to execute a method for compressing data. The processor is configured to receive a data string for compression, create a template based on processing the data string, and create one or more entries that include information that is different from the template. The template includes information that is common across two or more of the data elements and each entry corresponds to a single data element. The system 100 further includes a memory unit that is configured to store the template and the one or more created entries. The template and the one or more entries represent a compressed form of the data elements and data string.

In this example embodiment, the processor and the memory unit are implemented by a computing device. The computing device may be implemented by any computing architecture, including stand-alone PC, client/server architecture, cloud computing architecture or any other appropriate architecture. The processor and memory may also be implemented in a chip, a microcircuit, an integrated circuit (IC) or microcontroller form. The method of compressing data is implemented as a software program on the computing device or chip or IC or microcontroller. The computing device or chip or IC or microcontroller is appropriately programmed to execute a method of compressing data that creates a template of information common to two or more data elements for compression and creates an entry that embodies information different to the template, wherein each entry corresponds to each data element.

Referring to FIG. 1, there is shown a schematic diagram of a hardware system for compressing data, which in the illustrated embodiment comprises a computing device 100. The computing device 100 is the system for compressing data. The computing device 100 comprises suitable components necessary to receive, store and execute appropriate computer instructions. The components may include a processor 102 or processing unit, read only memory (ROM) 104, random access memory (RAM) 106, input/output (I/O) devices such as disk drives 108, input devices 110 such as an Ethernet port, a USB port etc.

In an alternative embodiment the computing device may include a single memory unit. In a further alternative embodiment the computing device may include ROM 104 and RAM 106 as well as additional memory units such as Flash memory and/or solid state memory.

The computing device 100 can further comprise a display 112 such as a liquid crystal display (LCD) or CRT screen, a light emitting display or any other suitable display, and a communications link 114. The computing device 100 includes instructions that may be stored in ROM 104, RAM 106 or disk drives 108 and may be executed by the processor 102. The instructions can be in the form of a software program or software programs. The instructions being executed by the processor 102 to cause the processor to execute a method of compressing data as described herein.

There may be provided a plurality of communications links 114 which may variously connect to one or more computing devices such as a server, personal computers, terminals, wireless or handheld computing devices. At least one of a plurality of communications link may be connected to an external computing network through a telephone line or other type of communications link.

The computing device 100 includes a suitable operating system which resides on the disk drive 108 or in ROM 104 of the computing device 100 or in RAM 106. The operating system may include suitable components such as process manager, a file handler, interrupts, memory manager, I/O system manager and a protection system. The operating system and its components can be implemented as a computer program.

The computing device 100 further comprises a system bus 120 that interconnects the processor 102 with the other components of the computing device 100. In the illustrated embodiment of FIG. 1, the system bus 120 interconnects the processor 102 with ROM 104, RAM 106, disk drives 108, input device 110, the display 112 and the communications link 114 and other components of the computing device 100.

A computer program with an appropriate application interface may be created and stored on the system or a memory unit. The machine readable memory unit, such as ROM 104, RAM 106 or disk drives 108, tangibly embody at least one program of instructions executable by the processor 102 to perform the capabilities or steps of a method of compressing data as described herein.

The computing device 100 comprise a casing 130 that houses and retains all the components of the computing device 100. FIG. 1 shows that the casing 130 houses at least the processor 102, the ROM, 104, RAM 106, disk drives 108 and the communications link 114. The casing 130 can be formed from any suitable material such as a plastics material.

Figure 2:
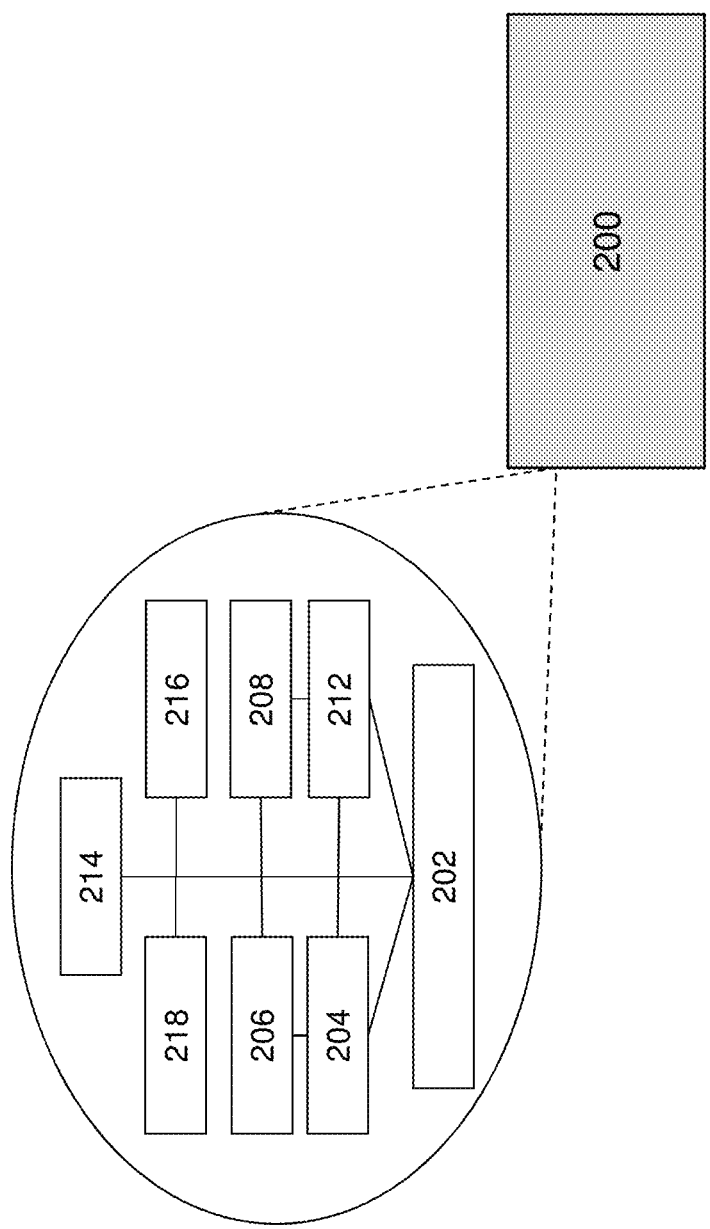
FIG. 2 shows a schematic diagram of a microcontroller that is configured to execute a method of compressing data.

FIG. 2 illustrates a further embodiment of a system for compressing data. FIG. 2 shows the internal components of a microcontroller that can be used to compress data by executing a method of compressing data as will be described herein.

Referring to FIG. 2, the microcontroller 200 comprises a central processing unit (CPU) 202, ROM 204, RAM 206, input/output (I/O) port or ports 208. The microcontroller 200 further includes a serial bus 210 or another suitable bus system that interconnects the CPU 202, ROM 204, RAM 206 and I/O ports 208. The microcontroller 200 may further comprise an analog to digital converter (ADC) 212, a digital to analog converter (DAC) 214, a clock signal generator 216 and one or more serial interfacing ports 218. The CPU 202 can also be referred to as a processor.

A computer program with an appropriate application interface may be created and stored on the microcontroller 200. The machine readable memory unit, such as ROM 204 or RAM 206 tangibly embody at least one program of instructions executable by the CPU 202 to perform the capabilities or steps of a method of compressing data as described herein.

Embodiments of a method of compressing data will be described with reference to the figures. The method of compressing data comprises the steps of receiving a data string for compression, creating one or more templates based on processing the data string, identify difference between each data element and the one or more templates, creating one or more entries and storing the entries. The data string comprises a plurality of data elements. The template includes information that is common to two or more data elements of the data string. Each entry corresponds to each data element and each entry comprises information from the data element that is different from the one or more templates. The one or more templates and the one or more entries relate to a compressed data string.

The data string may be a plurality of data in any format. The data string comprises a plurality of data elements, wherein each data element is a subset or component of the data string. The data string and data elements can be any format. For example the data string may be a plurality of data files or documents or a video stream or an image stream or an audio stream. Each data element of the data string is a single data unit such for a data string of video data each data element is a frame or if the data string is a plurality of documents, then each data element is a single document. In an example the data string comprises a plurality of data files and each data element is a single data file.

Figure 3:
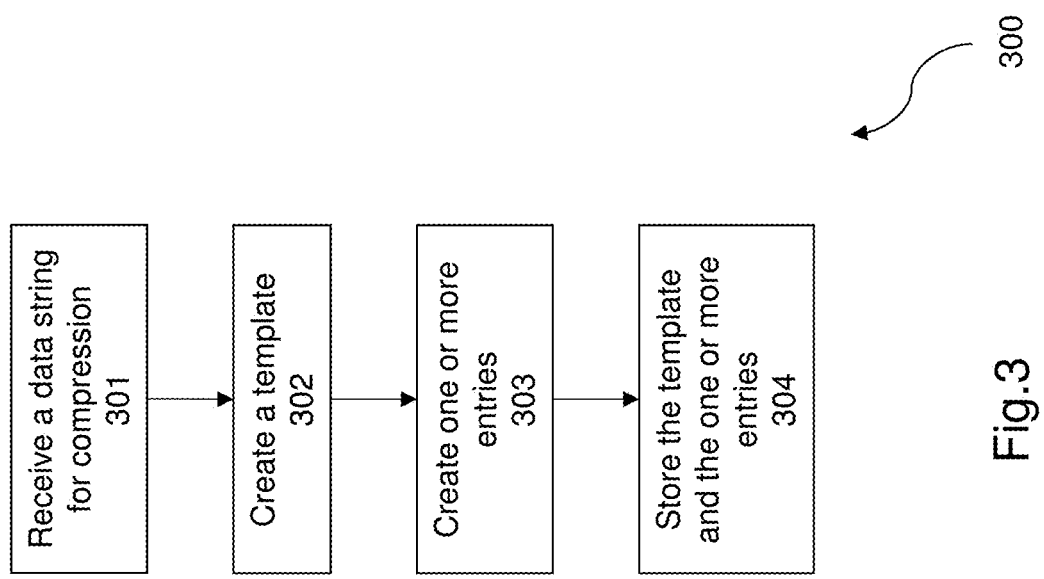
FIG. 3 shows an embodiment of a method of compressing data.

FIG. 3 shows an embodiment of a method of compressing data 300. The method of compressing data 300 is implemented by a hardware system such as for example, by the computing device 100 or the microcontroller 200 described earlier. The method of compressing data 300 is stored in memory as a set of executable instructions. The processor 102 of the computing device or the CPU 202 of the microcontroller 200 are configured to read and execute the stored instructions and perform the method of compressing data on an incoming data string.

Referring to figure the method of compressing data 300 begins at step 301. At step 301 the processor receives a data string. The data string comprises a plurality of data elements. In the illustrated embodiment of FIG. 3, each data element is a data file. The data handler of the operating system can be received and initially processed by the data handler of the operating system. In an alternative embodiment the data string may be received by an appropriate hardware or software interface and passed to the processor for compression.

At step 302 the processor is configured create at least one template by processing the data string. The template includes information that is common to across two or more data elements. The common information may be data structures that are embodied within the data elements. For example data structures may be titles, headings, headers, footers, lines, shape outlines and so on. The data structures are dependent on the format of the data element. Alternatively, the processor may be configured to create a set of common templates. The template is created as a file and stored in an appropriate memory unit.

The method proceeds to step 303, in which the processor is configured to create one or more entries, wherein the one or more entries include information that is different between a data element and a template. Each entry corresponds to a single data element.

Step 304 comprises storing the at least one template and the one or more entries in an appropriate memory unit. Each entry includes the information that is present in the data element and different to an appropriate template. The compressed data or information includes one or more templates and one or more entries.

Figure 4:
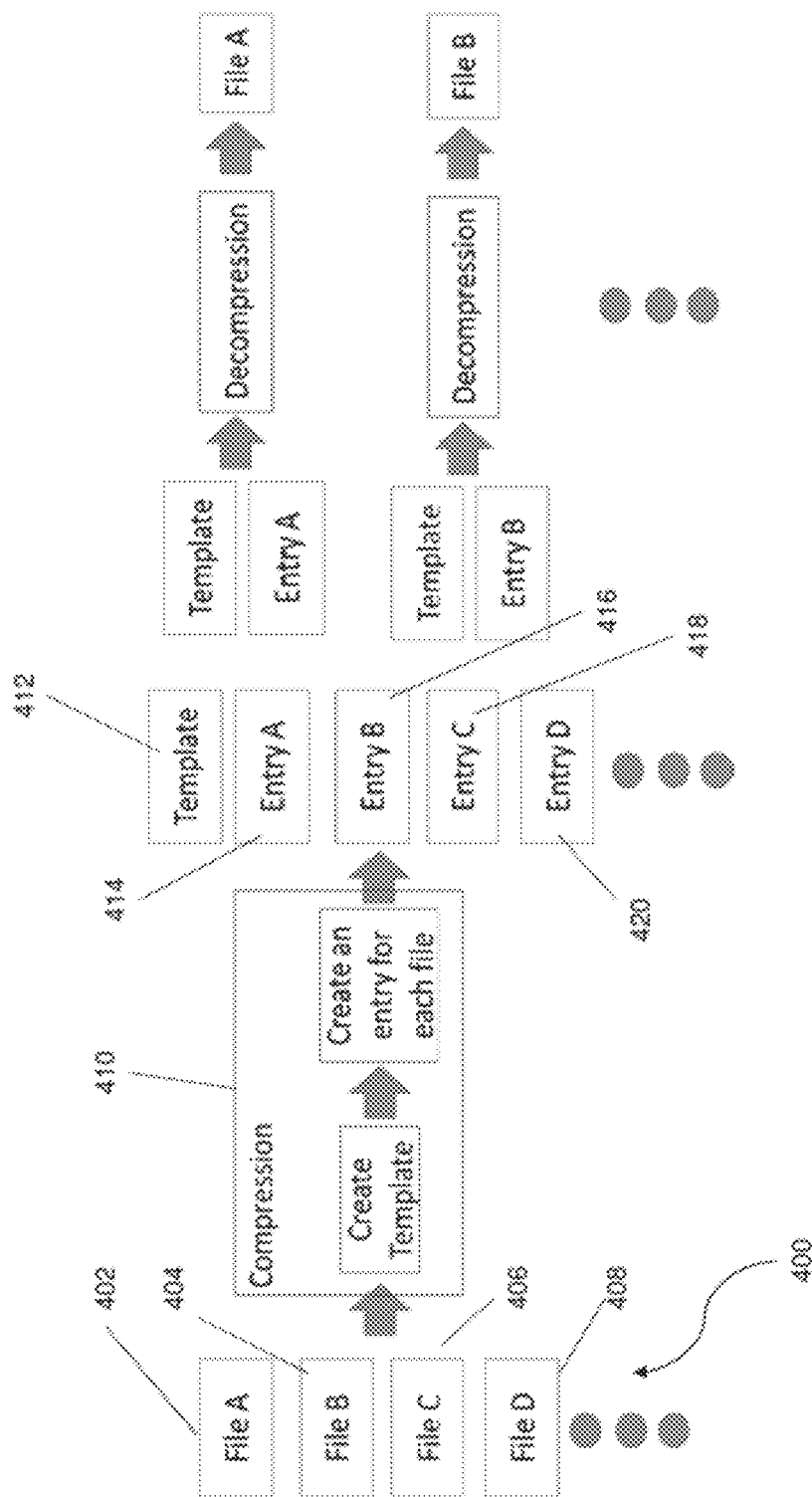
FIG. 4 shows a schematic diagram of the process flow within a system for data compression as the system implements a method of compressing data.

FIG. 4 shows a schematic diagram of the process flow within a system for data compression. The process flow can occur in the computing device 100 or the microcontroller or any other suitable hardware system used to implement and execute the method of data compression 300.

Referring to FIG. 4, a data string 400 is received by the by the computing device 100 or the microcontroller 200. The string 400 comprises a plurality of data elements 402, 404, 406, 408. Each data element is a file and are illustrated as File A to File D in FIG. 4. The data elements, and hence the data string, undergoes compression 410 by the processor 102, 202. The processor 102, 202 can execute the method 300 as described above. As described to compress the data elements a template is created and an entry corresponding to each data element is created. FIG. 4 shows compression of the file A to file D includes creating a template and creating an entry for each file, wherein each entry corresponds to each file. As shown in FIG. 4, the entries can be labelled to identify the corresponding file. For example, the entries are labelled as entry A to entry D. As can be seen in FIG. 4, the template 412 and the entries 414, 416, 418 and 420 are stored in a memory unit in the system for compressing data.

Figure 5:
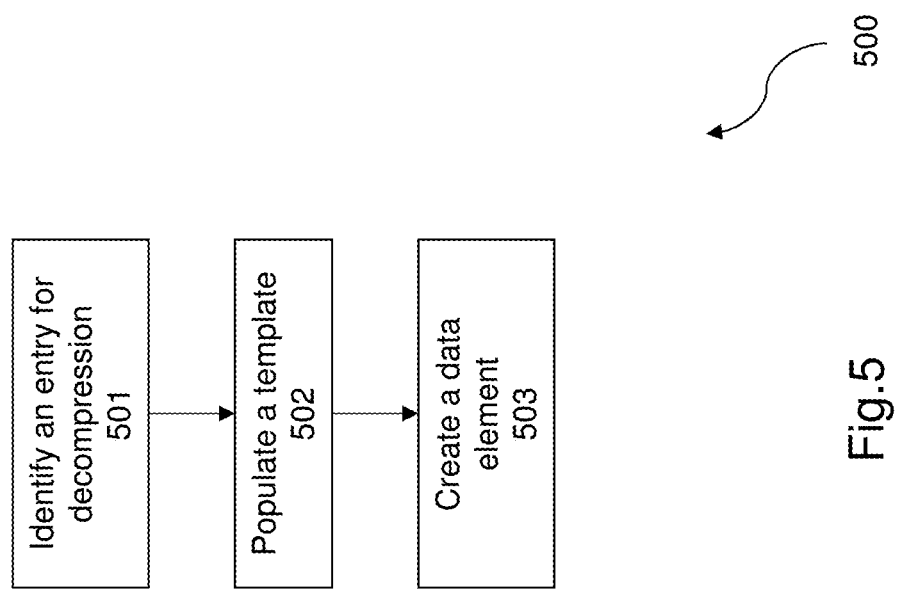
FIG. 5 shows an embodiment of a method of decompressing data, the method of decompressing data being executable by a hardware system.

The compressed data elements can be decompressed using a method of decompression. The processor of the hardware system is configured to execute the decompression method in response to a command or instruction to decompress stored data. FIG. 5 shows an embodiment of a method of decompression that can be implemented by the processor 102, 202. The method of decompressing data comprises the step 501. At step 501 the processor is configured to identify an entry for decompression. Step 501 may also comprise the processor identifying a plurality of entries for decompression. At step 502 the processor is configured to populate a template with the information included in the entry. At step 503 the processor is configured to create a file or data element that includes information from the template and information from the entry. The created data file or data element corresponds to a decompressed data element or data file. The method of decompression is advantageous because the data element is recreated with no information loss. At step 502 the processor can use a single template or a template that corresponds to a specific entry to decompress the entry.

FIG. 4 also shows the process flow for decompressing entries. As illustrated in FIG. 4, the processor 102, 202 is configured to identify data entries for decompression. Referring to FIG. 4, entry A and entry B are identified for decompression by the processor 102, 202. Each identified entry is associated with the template. The method of decompression is used by populating the template with the information from the entry to recreate the corresponding file. The corresponding file is the decompressed version of the corresponding entry. In FIG. 4, file A relates to a decompressed entry A while file B relates to a decompressed entry B.

Figure 6:
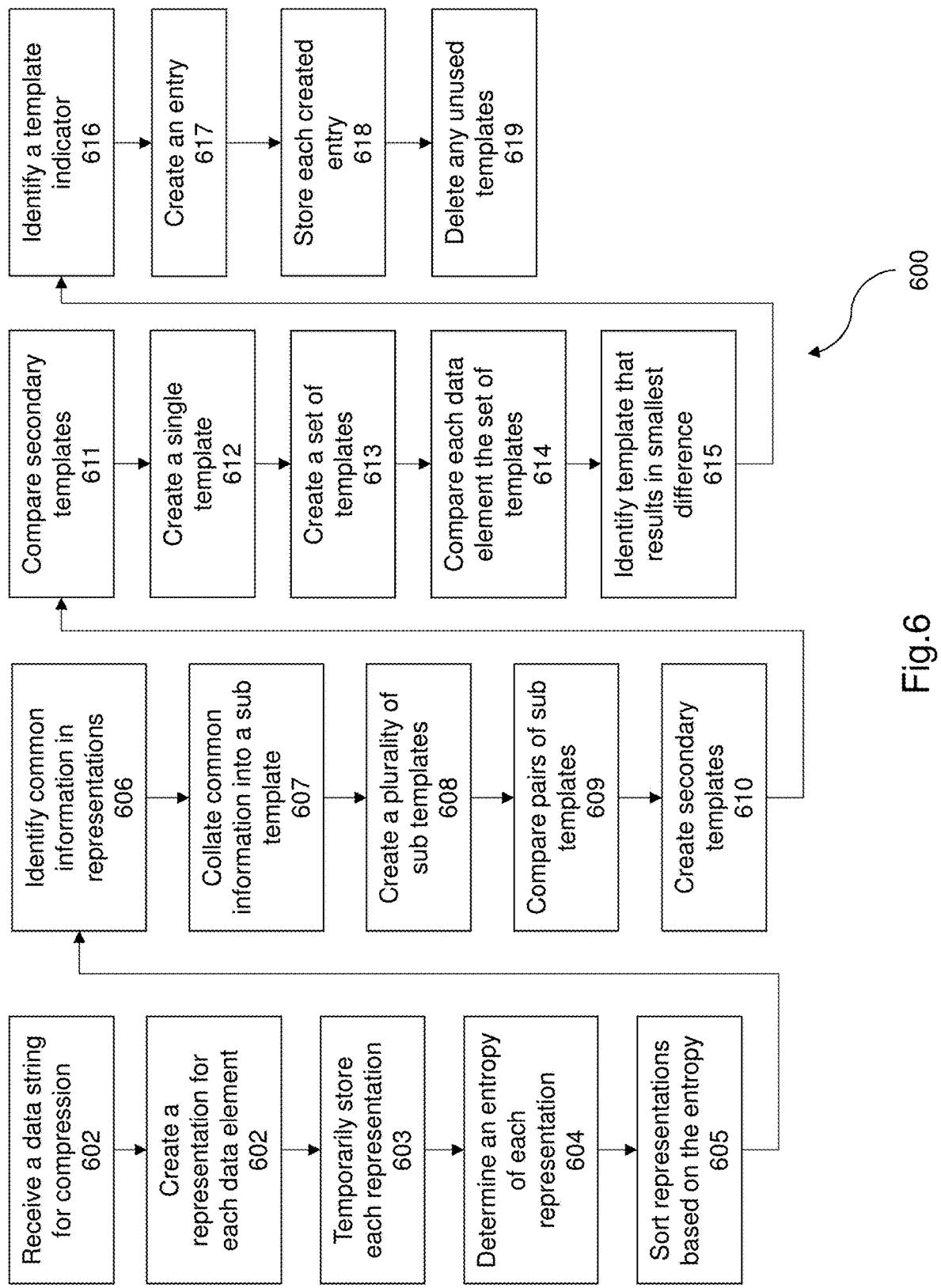
FIG. 6 shows a flow diagram of an embodiment of a method of compressing data, the method being executable by a hardware system.

FIG. 6 shows an embodiment of a method of compressing data 600. The method shown in FIG. 6 is stored as computer readable and executable instructions in a non-transitory memory unit such as ROM or RAM or a disk drive. A hardware processor, such as processor 102, 202 is configured to execute the instructions such that the processor can execute the method of compressing data 600 to compress received data.

Referring to FIG. 6, the method of compressing data 600 comprises the following steps. The method comprises step 601. At step 601 the processor receives a data string, comprising one or more data elements, for compression. The processor is configured to process the data elements to create a template based on common information within two or more data structures.

The method steps to create a template will be described in more detail. At step 602 the processor 102, 202 is configured to create a representation of each data element. The representation may be a format specific representation. The representation is a format that allows the processor 102, 202 to compare data elements with each other.

At step 603, the processor 102, 202 is configured to temporarily store each representation of each data element in a memory unit. At step 604 the processor 102, 202 is configured determine an entropy of each representation. Entropy or file entropy is the representation of data sets in the specific file. The processor is configured to determine entropies of each data element using any suitable process. At step 605 the processor is configured to sort the representations based on the entropy of each representation. The representations may be sorted or arranged in descending order of entropies. Alternatively the representations may be sorted or arranged in ascending order of entropies. In a further alternative the representations may be sorted such that representations with similar entropy values are associated or grouped.

Step 606 includes the processor comparing pairs of representations to identify information common to the pair of representations. In one example the common information may be data structures that are common to the pairs of representations.

At step 607 the processor is configured to collate the common information into a sub template. Each sub template may include information common to a pair of representations. At step 608 the processor is configured to create a plurality of sub templates, wherein each sub template includes information that is common to at least a pair of representations. At step 609 the processor is configured to compare pairs of sub templates to identify common information across the sub templates. At step 610 the processor is configured to create additional secondary templates based on comparing pairs of sub templates. The secondary templates include common information across at least a pair of sub templates.

At step 611 the processor is configured to further compare the secondary templates with each other to identify common information across the secondary templates. Step 612 includes the processor creating a single template based on the information that is common across the secondary templates. In one example, the process uses the secondary templates to build further secondary templates in a way 606-611 has done, whilst the number of newly created templates is halved. This looping continues until there is only one template left. As an example, if there are 32 inputs, there are 16 sub templates, 8 secondary templates and then there are 4 third-level templates from secondary templates, then there are 2 fourth-level templates, and at last a single template.

At step 613 the processor 102, 202 is configured to collate and store the single template, secondary templates and sub templates in a memory unit. The single template, secondary templates and sub templates are stored in a template folder or file, as a set of templates. The set of templates may be packaged into a single archive such as a ZIP archive using a Deflate compression algorithm. The set of templates may be packaged into a folder, wherein each sub template and/or secondary template and/or single template is stored as a .template file, with a unique name for each separate sub template or secondary template or single template for easy identification. The .template file (i.e. a single template) can be removed from the folder and moved, but a link to the location of the specific .template file must be stored in the folder storing the set of templates for easy access to the moved .template file during decompression.

The single template, secondary templates and sub templates may alternatively be temporarily stored in a memory unit such as ROM or RAM or disk drives or any other suitable non transitory computer readable media.

The processor 102, 202 may be further configured to identify a template penalty value when comparing pairs of sub templates. The template penalty value is greatest value of the differences between the template and each of the pair of sub templates. If the template penalty value is greater than 10% of the size of the input sub templates, then the processor is configured to store each sub template separately in the folder of templates. A similar process and parameters may be applied to the comparison of secondary templates. Further if the total number of templates and sub templates is greater than one-fourth the number of input data elements or one if the number of elements is less than 4, the processor 102, 202 is configured to revert to using a standard compression method such as a Deflate compression algorithm. In an embodiment the processor may be configured to implement the steps of creating a template as described with respect to FIG. 6, as part of the method 300 for compressing data.

The method of data compression 600 proceeds to compress data elements. The processor is configured to compress each data element using the template, a secondary template or a sub template. The method steps for creating and storing an entry will now be described. At step 614 the processor is configured to compare each data element, from the data string, with the set of templates to identify one or more differences between the data element and a template or sub template or secondary template. Step 615 comprises the processor identifying a template or secondary template or sub template, from the set of templates that results in the smallest difference with each data element. At step 616 the processor is configured to identify an indicator of the corresponding template or sub template or secondary template identified in step 616. Step 617 comprises the processor creating an entry, wherein the entry is a compressed data element and the entry includes the information that is different between the data element and the identified template or secondary template or sub template. The information in the entry is the smallest difference in information between the data element and the identified template or secondary template or sub template. Each created entry corresponds to a single data element and represents a compressed data element.

At step 618 the processor is configured to store each created entry in a memory unit such as for example in ROM, RAM or a disk drive. At step 619 the processor is configured to delete any secondary templates and/or sub templates that were not used in creating the entry. The folder of templates includes only sub templates, secondary templates that are used in creating entries. The folder of templates also comprises one single template that is created using the steps of creating a template as described above. The processor is configured to update the set of templates to include a new sub template or secondary template if new common information is identified in the step 614. The method 600 is implemented by the processor to compress and store a received data string in a non-transitory computer readable memory such as ROM or RAM or any other suitable memory unit.

Figure 7:
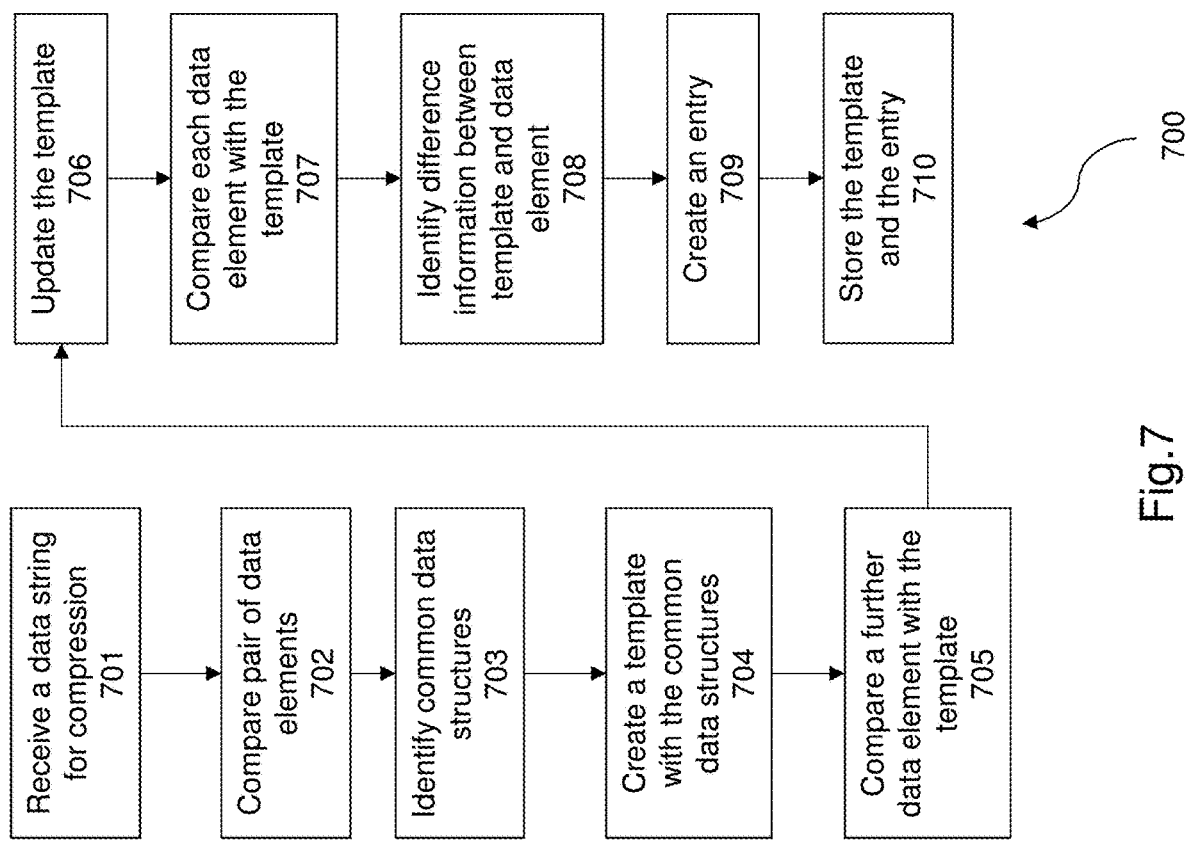
FIG. 7 shows a flow diagram of a further embodiment of a method of compressing data.

FIG. 7 shows an embodiment of a method of compressing data 700. The method of compressing data 700 is executed by the processor 102, 202. Method 700 begins at step 701. At step 701 the processor is configured to receive a data string for compression, wherein the data string comprises a plurality of data elements. At step 702 the processor is configured to compare a pair of data elements from a data string with each other. At step 703 the processor is configured identify common data structures within both data elements. At step 704 the processor is configured to create a template that includes the common data structures. The template may be stored in a folder within a memory unit of the hardware system for compressing data. For example the template may be stored in ROM 104, 204 or RAM 106, 206. Alternatively the method may identify information common to the pair of data elements that may be information other than data structures within the data elements.

At step 705 the processor is configured to compare a further data element or the next data element from the data string, with the created template to identify any common information or common data structures within the further data element. At step 706 the processor is configured to update the template to include any additional data structures that are common between the further data element and at least one of the prior data elements. Steps 705 and 706 can be repeated until all the data elements have been considered to create the template. The template is constantly updated after processing each subsequent data element with any identified common data structures. The template can effectively be grown as more data elements from the data string are processed. The created template may be stored as a .template file in a folder or a compressed archive such as a ZIP archive.

In method 700, the processor is configured to create a single template of common data structures. The single template is used to compress each data element in the data string. Method steps 702 to 706 define a method of creating a template. These method steps may be executed by the processor as part of step 302 in method 300.

The method of compressing data 700 proceeds to step 707. At step 707 the processor is configured to compare each data element with the common template. At step 708 the processor is configured to identify information that is different between the data element and the template. At step 709 the processor is configured to create an entry. The entry is created by storing the information present in the data element that is different from the information of the template. Each created entry corresponds to a single data element. Each entry relates to or represents a compressed data element. The processor is configured to create a plurality of entries. At step 710 the processor is further configured to store each entry and the template in a memory unit. The compressed record comprises the common template and all the entries. The compressed entries and template can be stored in an archive such as a ZIP archive. At least steps 705 to 709 can be repeated until all the data elements from a data string have been compressed into entries. Subsequently the processor is configured to store all the entries and the template in a memory unit, in an appropriate format such as a folder or a ZIP archive.

Figure 8:
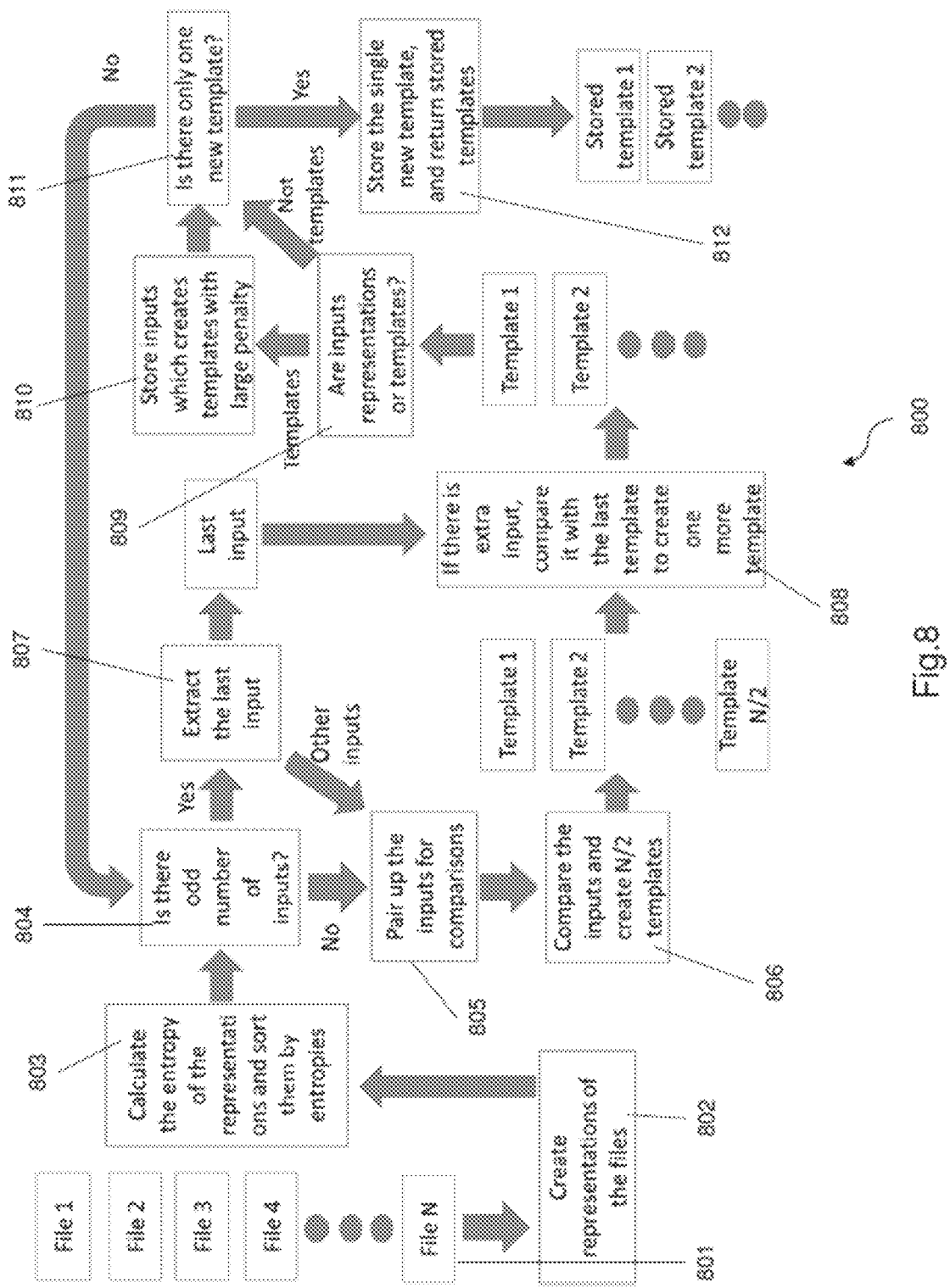
FIG. 8 shows a flow diagram of a method of creating a template, the method of creating a template being part of a method of compressing data.
Figure 9:
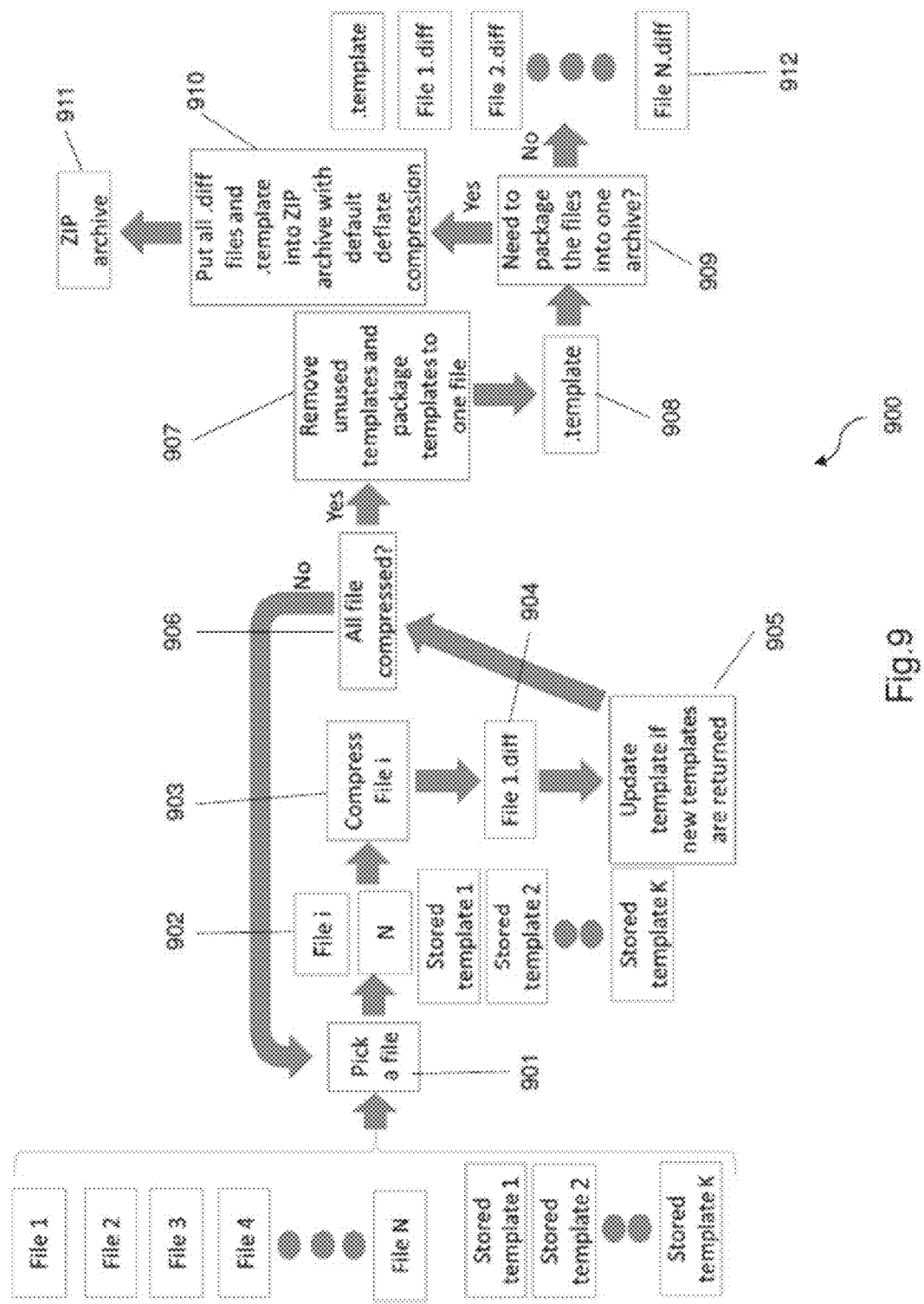
FIG. 9 shows a flow diagram of a method of creating an entry, the method of creating an entry being part of a method of compressing data.

Referring to FIGS. 8 and 9 there is illustrated a further method compressing data. FIG. 8 shows an embodiment of a method of creating templates 800. The method of creating templates 800 is a sub method of the overall method of compressing data. FIG. 9 shows an embodiment of a method of creating an entry 900 using one or more templates created in the method 800. The entries created by the method 900 represent compressed data elements. A method of compressing data comprises a combination of the method of creating template 800 and a method of creating an entry 900.

Referring to FIG. 8, a method of creating templates 800 will be described in more detail. The method 800 is implemented and executed by a hardware processor such as processor 102, 202 from the system for compressing data. The method 800 begins at step 801. At step 801 the processor receives a data string. The data string comprises a plurality of data elements. As shown in FIG. 8, the processor receives a plurality of files labelled File 1, File 2 and so on until File N. Step 802 comprises creating representations of the files. The processor is configured to create representations of each file in a common format so that the files can be compared with each other. At step 803, the processor is configured to calculate the entropy of the representations and sort the representations by entropies. At step 804, the processor is configured to check if there are an odd number of inputs i.e. an odd number of data elements. If no, then the method proceeds to step 805. At step 805, the processor is configured to pair the inputs i.e. representations for comparisons. At step 806, the processor is configured to compare the inputs and create templates. The processor creates N/2 templates wherein N is the number of data elements received for compression. FIG. 8 shows that a plurality of templates are created by processor labelled as Template 1, Template 2 to Template N/2.

If at step 804 there is an odd number of inputs, the processor is configured to extract the last input i.e. the last representation that corresponds to a data element at step 807. The last input is used by the processor at step 808. At step 808, the processor is configured to compare the last input or extra input with the last template to create an extra template. At step 809, the processor determines if the inputs are representations or templates. If the inputs are templates, the method proceeds to step 810. At step 810 the processor is configured to store the inputs which creates templates with a large template penalty. The processor is configured to determine a template penalty when comparing pairs of templates, and if the template penalty is greater than 10% then the input templates are stored and no further template or secondary template is created. If the template penalty is less than 10% then a new template is created that includes common information across the pair of templates that are compared to each other. This process can be repeated until a single template is generated by the processor i.e. the processor is configured to compare pairs of templates to generate a new secondary template that includes information common to the compared pair of templates and repeat the process until a single template is generated. At step 811 the processor checks if a single new template has been generated. If no then the method returns to step 804 and the processor is configured to repeat process steps 804 until 811. The processor may be configured to repeat process steps 804 to 811 until a single template is generated.

At step 809 if the representations are not templates, the method proceeds to step 811. If the representations are not templates then this can indicate that the compression method and method of creating templates has encountered an error. The answer at step 811 would be returned as no and hence the processor would repeat steps 804 to 811 until the check at step 811 returns a single new template as YES.

If there is a single template that is identified at step 811 i.e. the check returns YES, then the method proceeds to step 812. At step 812 the processor is configured to store the single template and stored templates as a set of templates. The set of templates is stored in a folder with each template or sub template being labelled with a unique label. For example each template will be labelled as a .template file. In one example the first template may be labelled as .template 1, the second template may be .template 2 and so on. Each .template file may be moved from the folder or archive of templates but a link to the new memory location of the .template file will be placed in the folder or archive. FIG. 8 shows the stored templates as Stored template 1, Stored template 2 and so on.

Referring to FIG. 9, there is illustrated a method of creating an entry using the template 900 to compress the data elements in a data string. The method 900 is stored as a set of executable instructions in a memory unit. The method 900 is executed by a processor of a hardware system for compressing data, such for example processor 102, 202. The method 900 comprises the following steps. At step 901 the processor is configured to select a specific data element, wherein the data element may be a data file for example. At step 902 the selected data element is compared with a set of templates. At step 903 the data element (e.g. a data file) is compressed by comparing the data element with the templates and sub templates in the set of templates.

At step 904 the processor is configured to identify differences between the data element and one of the stored templates. The processor is configured to identify the template that results in the smallest difference i.e. different information between a data element (e.g. a data file) and a template from the set of templates. The i.e. information that is different between the selected template and the data element is stored as an entry in the memory unit. Each entry can be stored as a file and labelled appropriately such that each entry can be called during any other operation. The entry also includes an indicator that points to the template used from the set of templates to create the entry. If the created entry is larger in magnitude that the original corresponding data element, the data element will be stored as the entry.

Step 905 comprises the processor updating the template if new templates are returned. The new templates are created if there is new common information or common data structures are identified. At step 906 the processor is configured to check if all the data elements, from a data string, are compressed. If no then the method 900 returns to step 901 and repeats steps 901 to 906. Steps 901 to 906 are repeated until all data elements are compressed.

The method proceeds to step 907 if the result of the check at step 906 is yes. At step 907 the processor is configured to remove unused templates. The processor deletes all templates and/or sub templates that were not used to create an entry. At step 908 the processor is configured to store the templates in a file or in a folder. In FIG. 9, the record of the templates may be stored as a .template record or folder. At step 909 the processor is configured to determine if the entries i.e. files need to be packaged into a single archive. If yes, at step 909 the processor is configured to execute step 910. At step 910 the processor is configured to place the created entries at step 904 and the templates created in method 800 into an archive using a suitable compression method such as a deflate compression. The archive can include all the templates created such as .template records and all the entries i.e. the .diff files. At step 911 all the templates and entries are stored in a ZIP archive. Alternatively if the check at step 909 returns a NO value, then the processor is configured to execute step 912. At 912 the processor is configured store the entries and template or templates in a memory unit.

Figure 10:
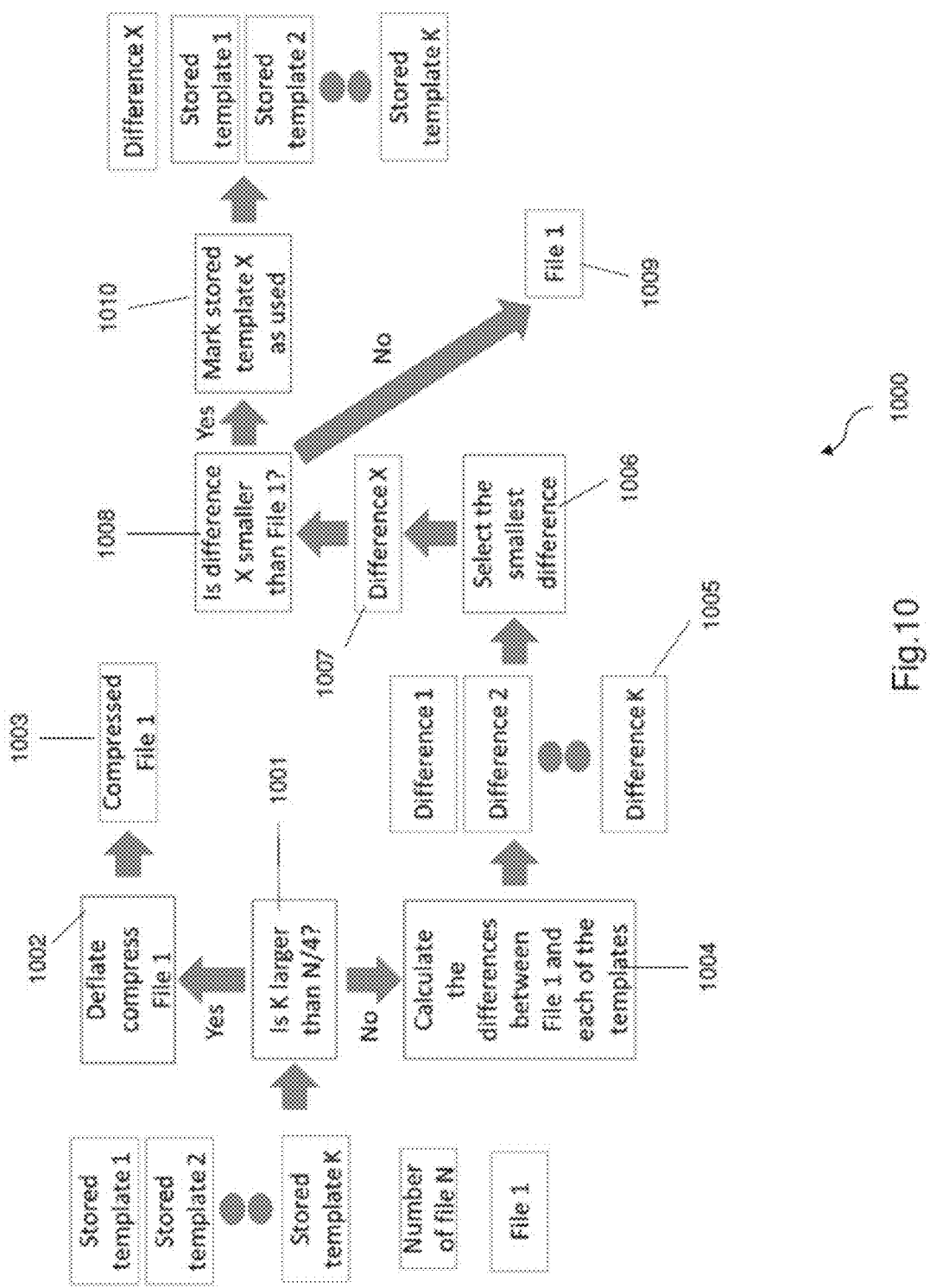
FIG. 10 shows a flow diagram of an example method of creating an entry.

FIG. 10 illustrates an alternative method of creating an entry 1000 and storing the entry. The following method 1000 can be used to compress additional files that may be received once an initial record of compressed entries and one or more templates has been created. As can be seen in FIG. 10, the hardware system may include K number of stored templates and N number of files i.e. entries. The processor receives a file for compression labelled as File 1. At step 1001 the processor is configured to check if the number of stored templates is greater than the number of files divided by 4 i.e. if K is larger than N/4. If YES, then the processor proceeds to step 1002, where the processor is configured to compress a new file (File 1) using a deflate compression algorithm. At step 1003 the new compressed File 1 is stored.

If at step 1001 the processor determines K is less than N/4 i.e. step 1001 returns NO, the processor proceeds to step 1004. At step 1004 the processor is configured to calculate the differences between File 1 and each of the stored templates. At step 1005 all the differences are analyzed by the processor. As can be seen in FIG. 10 there differences from difference 1 to difference K. Each labelled difference corresponds to a difference between file 1 and a template. At step 1006 the processor is configured to select the smallest difference from the identified differences. At step 1007 difference X is the smallest difference. At step 1008 the processor is configured to check if difference X is smaller than the size of the original file i.e. is difference X smaller than file 1. If No, the processor is configured to store File 1 without compressing it or modifying it, as shown at step 1009. If the check at step 1008 returns yes i.e. the smallest difference between a file and a template is smaller than the size of the file, then the processor is configured to execute step 1010. At step 1010 the processor is configured to create an entry that includes the difference and an indicator pointing to the template that was used. The entry corresponds to a compressed file 1. The entry is shown as Difference X and is stored in a compressed record. The compressed record comprises the templates and other entries that correspond to other files that have been compressed.

The method 1000 can be applied to compress any additional received file following an initialization process. The initialization process can include either creating templates only or creating templates and creating entries of a first group of files for compression. The initialization process may include any one of the methods described earlier such as method 600, 700 or a combination of 800 and 900. The method 1000 can be used in conjunction with any one of the method described earlier.

In an embodiment the method of compressing data may comprise the additional step of executing an optimization process to optimize the compressed data. The processor may be configured to execute the optimization process to optimize the overall compression. The processor is configured to execute an optimization process, wherein the optimization process comprises decompressing all entries that are a size that is more than half the size of the corresponding data element. The optimization process further comprises the processor being configured to recompress the decompressed entries by comparing the decompressed entries with a set of templates to create new compressed entries that are less than half the size of corresponding data element. Removing files from an archive is simply removing the corresponding differences files i.e. entries. No changes to templates are done as part of the optimization process.

Additional details and examples of specific method of compressing data steps will now be described. Below is a non limiting exemplary description of creating representations that are used in any one or more of the methods of compressing data described earlier. Unlike text files, many file formats have complicated data structures such as for example Adobe PDF files. Some file formats are in a compressed format by default such as Microsoft documents, images or videos. In order to compare files directly a representation is needed for each type of file format to allow content comparisons, support features of corresponding files and allow creation of identical copies of the file without damaging or corrupting information in the original file. An example implementation of creating representations will now be described. In this example a docx file can be transformed into a representation by the processor. The docx file can be converted into an XML file. The XML file is a representation. The XML file can include data structures from the docx file such as font tables, styles, properties etc. The XML representation can be compared with other XML representations of other docx files. A docx file is an inherently compressed record. The XML representation corresponds to a decompressed docx file. FIG. 11 shows an example of a representation of a docx file 1100. The XML document includes themes, image information, styles, settings, font table etc. For video files a set of representations of frames may be used as a representation. The representation 1100 of the docx file is an example.

As described in the methods of data compression the data files or data elements are compared with each other to identify common information. Following creation of a representation a template or templates need to be created. An example of creating templates will be described. This exemplary process of creating templates can be executed by the processor as part of any of the methods of data compression as described earlier. After defining a file representation for a file, a metric needs to be defined to show the difference between two representations and identify common information. The defined metric is also used to measure the difference between a template and a data element which will be in a representation format. The same metric will also be used to identify any template penalty. To create a template, the processor is configured to identify representations that are common in name. For each pair of common representations, a Smith-Waterman algorithm is used to find out the optimal common part among the representations. The difference between text files or representations is defined by their Levenshtien distance that is calculated by the Wagner-Fischer algorithm. The penalty scores are 0 for matching equal characters and gap extension, and 1 for matching different characters and gap opening. For example, app.xml is the file from data file 1 (i.e. a first data file) has content <xml>AACAAd</xml>. The representation app.xml corresponding to a second data file (i.e. data file 2) has content <xml>AA-A--</xml>. In this example—denotes unequal character match or a gap. The new app.xml will be created with content <xml>AAA</xml>. The created files are packaged together appropriately depending on the file structure of the representation format used. To determine the penalty of the template, the difference between the template and each representation is calculated as described earlier. The larger of the difference is defined as the template penalty. Since templates are constructed to share the same structure of a file representation, the procedure of creating templates based on two templates is the same as based on file representations. As described in the methods above, templates are compared with each other, by the processor, using the same structure of a representation.

For image formats, the processor is configured to create a representation that includes a set of histograms. The common parts of the histograms can be found by changing the bytes in histograms to hex values. The processor can then be configured to run the Smith-Waterman algorithm on hex values to create a template that includes common information across two or more image files.

A non limiting example of creating an entry based on the template will now be described. The following description is an example process that can be executed by a hardware processor to create a template. The following processor can be included as part of any one of the methods of compressing data as described earlier. Creating an entry i.e. a difference file is similar to creating a template. In this example files with names that are common in the file (i.e. data element) and template are selected for comparison. For common text files, the Wagner-Fischer algorithm is used to calculate the edit distance i.e. the Levenshtein distance. An edit procedure that can be used to edit the data element or the template or both may be stored in or as a JSON object in the entry that corresponds to the original data element. In this example of creating an entry, app.xml from the data element has content <xml>AACAAd</xml>, while app.xml from the template has content <xml>AAAdk</xml>. The app.xml is a representation of the template and data element. The processor is further configured to execute or apply the Wagner-Fischer algorithm that shows the edit distance to be three, with edits "Add C before the $6^{th}$ character, add A before the $7^{th}$ character and then remove the $12^{th}$ character". Then a new app.xml is created with content {5:CA,11:-}. 5, 11 are $6^{th}$ and $12^{th}$ characters in a 0 based setting. The action of adding C and A are combined as they are adding characters at the same place. Changing characters are stored as deletion followed by insertion at the same place. The new files are packaged together according to the file structure of the representation and form of the entry (i.e. difference file).

Following the above comparison, the data elements that are unique are placed in an entry. The files that are different to the template are stored as individual entries. If there is a data element that includes information or data structures that are completely identical to a template, then the corresponding entry is an empty file with same name as the template.

A template identification is created and stored in the entry. The template identification includes an ID or number of the template used to create the entry. The template identification can be stored as a .templateID file within the entry. The identification of the template may be for example an index of the template in a set of stored of templates or in a set of stored sub template and secondary templates as described earlier. Alternatively the identification of a template may be the SHA1 hash of a specific template. For example if a second template is used to compress the data element and create a corresponding entry, the entry will include the index of SHA1 hash of the second template. An escape character, such as "." may be added after the name of the template ID file. The entry (i.e. difference file) shares the same structure of a representation meaning it is likely a folder that consists of a list of files and sub folders. To store it in a memory unit, a ZIP archive is used to store all content and structure of the entry and the name of the archive is set as the name of the entry plus a .diff extension. Therefore in one example data element File 1.docx becomes File 1.docx.diff.

For multimedia files, if the representation is the same as the template (in size and SHA1 has), nothing new is created as an entry i.e. difference file. Otherwise the multimedia data element is stored as an entry in the appropriate format. For image data elements, as the hex values of histograms are essentially text, the process of creating a text file can still apply.

In one example combining templates is performed by the processor. The processor is configured to create a folder to store each template or sub template. A single folder stores a single template and is labelled with the ID of the template. The processor is configured to create multiple folders, each folder including a single template. The folders are compressed into a ZIP archive. The archive can be named with a suitable extension such as .template.

As described earlier, with respect to FIG. 5, the processor is configured to execute a method of decompressing data. An example implementation of the method of decompression will now be described. The processor is configured to read the template ID from an entry and identify the appropriate template. With the ID, a template is copied from the .template archive or folder to a new temporary file. For each file in the temporary file, a file with the same name is selected from the entry archive. If the file from the entry has empty content, the file in the temporary record is removed. Otherwise, a JSON file is extracted from the entry for an edit sequence to edit the file in the temporary record. If no file is found in the entry, the file will be left unchanged. After that, the files that are not in the temporary record but stored in the entry file are copied back to the temporary record. The temporary record becomes the representation of the file or data element to reconstruct. As the representation of a docx file is the decompressed archive, the output docx file is created by compressing the temporary record.

An example implementation will now be described. The methods of compressing data as described herein are particularly useful for compressing numerous documents into a smaller record. In particular the methods described herein are particularly suited for compressing text based documents. In this example the processor is configured to compress a plurality of documents such as electricity bills using a method of data compression as described earlier. In this example method 700 as described will be used to illustrate an exemplary implementation. An electricity company can issue several millions of bills to customers every year. To keep a record of these millions of bills requires a lot of space on the memory. These bills are stored in a memory unit of a computing system such as a PC or a server or a cloud computing environment. Each bill is a data element. A processor of a computing system is configured to compare a first pair of bills and identify common data structures that are common in the two bills. Common data structures can be the format of the bills, and the only difference between the bills is the dollar amount billed, the address and the name of the recipient. The template is created that comprises the common data structures. Each subsequent bill is processed and the common data structures are extracted from and added to the template. The template may be updated to include any additional data structures that may be identified as common. The template will store various common data structures such as headings, lines, paragraphs, text etc. The template is used to compress each bill by creating an entry that corresponds to each bill. Each entry includes the difference between a bill and the template. The difference information is dynamic information that can vary from bill to bill. Each entry can include the unique dynamic information in each bill such as names, billing amount, address etc. The template and the entries are all stored in a memory unit.

Any one of the methods of data compression as described herein are particularly useful for compressing text based files such as Adobe PDF files or Microsoft documents. However the methods of data compression as described herein are also useful in compressing non text type files or data streams such as graphics files, multimedia files, video files, audio files, image files and so on.

The methods of compressing data 300, 600, 700 and the combination of 800 and 900, as described above compress data elements or data strings by identifying a set of templates that includes common information across the data elements in a data string. The methods of compressing data as described herein determines one or more templates to reduce redundancy. The methods of compressing data are particularly suited for compressing data that includes similar files or data elements such as archiving invoices from a single company, bank statements of an account or compressing security footage from a single camera. The methods of compressing data are advantageous because the compressed entries are the difference between the original data element and at least one template. Hence users can read the special parts or key points of a data element by reading the entry. This is advantageous and useful in investigations and forensics, which often need to extract unusual data from an overwhelming number of common files. Further a template is not bound to a particular archive. A user can copy one or more templates from an archive to compress other data elements with similar content. Further a plurality of templates can be combined into a single template or into a single template folder. The template folder can be uploaded to a public domain or shared with other users to allow other users to compress data. The methods of compressing data is also advantageous because it allows real time compression of a data string.

The presently described methods of compressing data are advantageous because the methods create a template that includes information or data structures that are common across all the data elements. The template or templates are created by initially processing all the data elements rather than a specific set of data elements, as done in prior art methods. The first data element that contributed to creating a template will contribute to the compression of all subsequent data elements. Prior art systems only look backward and forward by a few data elements, whereas the current compression methods consider and process all data elements to create a template that is used to compress the data elements and any subsequently received data elements.

The inventors have tested the method of compressing data that includes methods 800 and 900. The inventors have also tested the method of compressing data 300 as described earlier. These methods have been tested on a docx format of data elements. The methods of data compression have been tested against ZIP (deflate best compression), 7z (Bzip2 best compression) and 7z (LZMA2 best compression) as benchmarks. The test data set was four bank statements from the same bank. The purpose of the test was to evaluate the performance of the method of data compression as per the disclosure. FIG. 12 shows a table illustrating the results of the test. As can be seen from the table 1200 of FIG. 12, the uncompressed data string was of a size of 89007 bytes. The column 1201 denotes the compression results of method of compressing data as per the present invention. The column 1202 shows the compression results of the ZIP (deflate best compression). Column 1203 shows the compression results of the 7z (Bzip2 best compression). Column 1204 shows the compression results of 7z (LZMA2 best compression). As shown in the table 1200 the present invention results in the highest compression ratio of 3.497 and results in a compressed data set that is smaller than the other known compression algorithms that were tested. The presently described method of data compression results in an even higher compression ratio as the data string for compression increases in size.

The presently described methods of compressing data is a universal data compression method, since the methods of compressing data utilizes the same process or method steps to compress any format of data such as for example documents, images, video data or audio data. In an embodiment the presently described methods of compressing data can be used to compress webpages, JPG, PNG images continuous video streams and computer systems too. The methods of compressing data is implemented as software in a hardware computing system. The methods of compressing data is advantageous because the method (i.e. software) does not need to handle the incoming data files or data strings or data stream. The methods of compressing data treat a file as a data string plus a binary data stream. Hence the method of compressing data can be used to compress files or data strings or data streams with known or unknown formats.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will be appreciated by persons skilled in the art that numerous variations and/or modifications may be made to the present invention as shown in the specific embodiments without departing from the spirit or scope of the present disclosure. The present embodiments are, therefore, to be considered in all respects as illustrative and not restrictive.

It will also be appreciated that where the methods and systems of the present invention are either wholly implemented by computing system or partly implemented by computing systems then any appropriate computing system architecture may be utilized. This will include stand-alone computers, network computers and dedicated hardware devices. Where the terms "computing system", "hardware computing system" and "computing device" are used, these terms are intended to cover any appropriate arrangement of computer hardware capable of implementing the function described.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or"). Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

Any reference to prior art contained herein is not to be taken as an admission that the information is common general knowledge, unless otherwise indicated. It is to be understood that, if any prior art information is referred to herein, such reference does not constitute an admission that the information forms a part of the common general knowledge in the art, any other country.

The invention claimed is:

1. A non-transient computer readable medium containing program instructions for causing a computer to perform a method for compressing data comprising the steps of:
   receiving a data string for compression, the data string including a plurality of data elements,
   creating a representation of each data element of the plurality of data elements, wherein the representation is a format that allows data elements to be compared with each other,
   creating a template based on processing the data string, the template including common information across all data elements of the data string,
   creating one or more entries, wherein the one or more entries include information that is different from the template, and
   storing the template and the one or more entries.

2. A non-transient computer readable medium in accordance with claim 1, wherein the step of creating one or more entries comprises the additional step:
   identifying the differences between each data element of the data string and the created template, and
   wherein each entry corresponds to a single data element of the plurality of data elements and the entry includes the difference between the data element and the template.

3. A non-transient computer readable medium in accordance with claim 1, wherein the step of creating the template comprises the steps of:
   comparing the data elements with each other,
   identifying common information across two or more data elements,
   creating a template that includes the common information across two or more data elements.

4. A non-transient computer readable medium in accordance with claim 1, wherein the method of compressing data comprises the additional steps of:
   temporarily storing each representation of each data element.

5. A non-transient computer readable medium in accordance with claim 1, wherein the method of compressing data comprises the additional steps of:
   determining an entropy of each representation, wherein entropy is a measure of data structures within the data elements,
   sorting representations based on the entropy of each representation.

6. A non-transient computer readable medium in accordance with claim 1, wherein the method of compressing data comprises the additional steps of:
   comparing pairs of representations to identify common information in a pair of representations,
   creating a plurality of templates that include common information, wherein each template includes common information in a pair of representations,
   creating N/2 templates, wherein N is the number of representations.

7. A non-transient computer readable medium in accordance with claim 1, wherein the method of compressing data comprises the additional steps of:
   comparing pairs of representations to identify information common to the pair of representations,
   collating the common information into a sub template,
   creating a plurality of sub templates, wherein the sub template includes common information in a pair of representations.

8. A non-transient computer readable medium in accordance with claim 7, wherein the method of compressing data comprises the additional steps of:
   comparing a pairs of sub templates to identify common information across the sub templates,
   creating additional secondary templates based comparing pairs of sub templates, wherein the secondary templates include common information across the sub templates,
   comparing the secondary templates with each other to identify common information across the secondary templates,
   looping the method disclosed in claim 1 to create templates of the templates, until there is only one template left,
   creating the template based on the common information across the secondary templates, wherein the template includes information that is common across the secondary templates.

9. A non-transient computer readable medium in accordance with claim 7, wherein the method of compressing data comprises the steps of:
   identifying a template penalty value when comparing pairs of sub templates, wherein the differences between the template and each of the pair of sub templates are calculated and the larger value is set to be the template penalty value
   if the template penalty value is greater than 10% then sub templates are stored separately.

10. A non-transient computer readable medium in accordance with claim 7, wherein the template and the separately stored templates are stored as a set of templates in a folder or a file.

11. A non-transient computer readable medium in accordance with claim 7, wherein the method of compression comprises the additional step of:
   comparing each data element with the set of templates to identify one or more differences between each data element and a template or secondary template or sub template, identifying a template or a secondary template or sub template from the set of templates that results in the smallest difference with each element,
identifying an indicator of the corresponding template or sub template or secondary template,
creating an entry, wherein the entry is a compressed data element and the entry comprises the smallest difference between a corresponding template or sub template or secondary template and the indicator,
storing the entry and;
deleting any secondary templates or sub templates from the set of templates that are not used in creating the entry.

12. A non-transient computer readable medium in accordance with claim 1, wherein the method of compressing data comprises the step of updating the template with additional common information identified in any additional data element that is processed.

13. A non-transient computer readable medium in accordance with claim 1, wherein the method of compressing data comprises the additional step of updating the set of templates to include a new sub template or secondary template if new common information is identified in the step of comparing the data element with the set of templates.

14. A non-transient computer readable medium in accordance with claim 1, wherein the step of creating a template comprises the additional steps of:
comparing a pair of data elements with each other,
identifying common data structures to both data elements in the pair of data elements,
creating a template that includes the common data structures,
comparing a further data element with the template,
updating the template to include additional data structures that are common between either the further data element and at least one or a pair of data elements, or the further data element and the template.

15. A non-transient computer readable medium in accordance with claim 13, wherein the template is constantly updated after processing each subsequent data element to identify data structures within each subsequent data element.

16. A non-transient computer readable medium in accordance with claim 13, wherein the method of compressing data comprises the additional steps of:
comparing each data element with the template,
identifying information that is different between the data element and the template,
creating an entry by storing the information that is different between the data element and the template, wherein each entry corresponds to a single data element.

17. A non-transient computer readable medium in accordance with claim 1, wherein the method of compressing data comprises the additional step of decompressing data based on an entry and a corresponding template, wherein the step of decompressing data comprises the additional steps of:
identifying an entry for decompression,
populating the template with information that is included in the entry,
creating a file or data element that includes information from the template and information from the entry, wherein the file or data element corresponds to an uncompressed entry.

18. A non-transient computer readable medium in accordance with claim 1, wherein the method of compressing data comprises the additional step of:
executing an optimization process, wherein the optimization process comprises decompressing all entries that are a size that is more than half the size of the corresponding data element, and,
wherein the optimization process further comprises recompressing the decompressed entries by comparing the decompressed entries with a set of templates to create new compressed entries that are less than half the size of corresponding data element.

19. A non-transient computer readable medium in accordance with claim 1, wherein the data string comprises a plurality of data files, wherein each data element is a data file.

20. A system for compressing data, the system comprising;
a processor, a memory unit,
wherein the processor is in electronic communication with the processor,
the memory unit configured to executable instructions defining a method of compressing data, the processor configured to execute the method of compressing data;
the processor being configured to receive a data string for compression, wherein the data string including a plurality of data elements,
the processor being configured to create a representation of each data element of the plurality of data elements, wherein the representation is a format that allows data elements to be compared with each other,
the processor being configured to create a template based on processing the data string, the template including common information across all data elements of the data string,
the processor configured to create one or more entries, wherein the one or more entries include information that is different from the template, and
the processor configured to store the template and the one or more entries in the memory unit.

21. A system for compressing data in accordance with claim 20, wherein the processor is configured to identify the differences between each data element of the data string and the created template, and wherein each entry corresponds to a single data element of the plurality of data elements and the entry includes the difference between the data element and the template.

22. A system for compressing data in accordance with claim 20, wherein the processor being configured to compare the data elements with each other, the processor being configured to identify common information across two or more data elements, and the processor configured to create a template that includes the common information across two or more data elements.

23. A system for compressing data in accordance with claim 20 wherein the processor being configured to temporarily store each representation of each data element in the memory unit, the processor being configured to determine an entropy of each representation, wherein entropy is a measure of data structures within the data elements, and the processor being configured to sort representations based on the entropy of each representation.

24. A system for compressing data in accordance with claim 20, wherein the processor being configured to compare pairs of representations to identify common information in a pair of representations, the processor being configured to create a plurality of templates that include common information, wherein each template includes common information in a pair of representations, and; the processor being configured to create N/2 templates, wherein N is the number of representations.

25. A system for compressing data in accordance with claim 20, wherein the processor configured to compare pairs of representations to identify information common to the pair of representations, the processor being configured to collate the common information into a sub template, the processor being configured to create a plurality of sub templates, wherein the sub template includes common information in a pair of representations, the processor being configured to compare pairs of sub templates to identify common information across the sub templates, the processor being configured to create additional secondary templates based comparing pairs of sub templates, wherein the secondary templates include common information across the sub templates, the processor being configured compare the secondary templates with each other to identify common information across the secondary templates, and the processor being configured to create the template based on the common information across the secondary templates, wherein the template includes information that is common across the secondary templates.

26. A system for compressing data in accordance with claim 25, wherein the processor being configured to identify a template penalty value when comparing pairs of sub templates, wherein the template penalty value is the difference between a pair of sub templates, and if the template penalty value is greater than 10% the processor being configured to store the sub templates separately as individual entries in the memory unit, and wherein the template and the secondary templates are stored as a set of templates in a folder or a file.

27. A system for compressing data in accordance with claim 25, wherein the processor being configured to compare each data element with the set of templates to identify one or more differences between each data element and a template or secondary template or sub template, the processor further being configured to identify a template or a secondary template or sub template from the set of templates that results in the smallest difference with each element, the processor being configured to identify an indicator of the corresponding template or sub template or secondary template, the processor configured to create an entry, wherein the entry is a compressed data element and the entry comprises the smallest difference between a corresponding template or sub template or secondary template and the indicator, the processor configured to store the entry in the memory unit and; the processor further being configured to delete any secondary templates or sub templates from the set of templates that are not used in creating the entry.

28. A system for compressing data in accordance with claim 20, wherein the processor being configured to compare a pair of data elements with each other, the processor being configured to identify one or more common data structures to both data elements in the pair of data elements, the processor configured to create a template that includes the one or more common data structures, the processor configured to compare a further data element with the template, the processor being further configured to update the template to include additional data structures that are common between either the further data element and at least one or a pair of data elements, or the further data element and the template.

29. A system for compressing data in accordance with claim 28, wherein the processor configured to updated the template after processing each subsequent data element to identify data structures within each subsequent data element, the template being stored in the memory unit.

30. A system for compressing data in accordance with claim 28, wherein the processor being configured to compare each data element with the template, the processor being configured to identify information that is different between the data element and the template, the processor being configured to create an entry by including the information that is different between the data element and the template into the entry, wherein each entry corresponds to a single data element, and the processor being configured to store the entry in a memory unit.

31. A system for compressing data in accordance with claim 20, wherein the processor is configured to execute an optimization process, the optimization process being stored as executable instructions in the memory unit, wherein as part of the optimization process the processor being configured to decompress all entries that are a size that is more than half the size of the corresponding data element, the processor further being configured to recompress the decompressed entries by comparing the decompressed entries with a set of templates to create new compressed entries that are less than half the size of corresponding data element, and the processor being configured to store the new compressed entries in a record on the memory unit.

* * * * *